United States Patent
Narahara

[19]

[11] Patent Number: 6,118,348
[45] Date of Patent: Sep. 12, 2000

[54] OSCILLATOR CIRCUIT HAVING SWITCHED GAIN AMPLIFIERS AND A CIRCUIT FOR PREVENTING SWITCHING NOISE

[75] Inventor: Tetsuya Narahara, Tokyo, Japan

[73] Assignee: NEC Corporation, Tokyo, Japan

[21] Appl. No.: 09/098,452

[22] Filed: Jun. 17, 1998

[30] Foreign Application Priority Data

Jun. 19, 1997 [JP] Japan ................................. 9-162485

[51] Int. Cl.[7] .................................................. H03B 5/36
[52] U.S. Cl. ................................. 331/116 FE; 331/158
[58] Field of Search .......................... 331/116 R, 116 FE, 331/158, 159

[56] References Cited

U.S. PATENT DOCUMENTS

| | | | |
|---|---|---|---|
| 4,965,535 | 10/1990 | Neuman | 331/116 FE |
| 5,041,802 | 8/1991 | Wei et al. | 331/116 FE |
| 5,208,558 | 5/1993 | Shigehara et al. | 331/116 FE |
| 5,557,243 | 9/1996 | Ho | 331/158 |
| 5,909,152 | 6/1999 | Li et al. | 331/116 FE |

FOREIGN PATENT DOCUMENTS 3-76404  4/1991  Japan .

*Primary Examiner*—Siegfried H. Grimm
*Attorney, Agent, or Firm*—Sughrue, Mion, Zinn, Macpeak & Seas, PLLC

[57] ABSTRACT

An oscillator circuit for preventing noise from occurring in an output clock signal. The oscillator circuit contains an amplifying unit and a control signal generator. The amplifying unit contains a first amplifying circuit having a first gain and a second amplifying circuit having a second gain connected in parallel. The amplifying unit inputs an oscillating input signal and amplifies it based on an overall gain of the amplifier unit to produce an oscillating output signal. The control signal generator inputs an input control signal and generates an output control signal, and the operational state of the first amplifying circuit is switched when a value of the output control signal switches. The overall gain is based on the first gain when the first operational state of the first amplifying circuit is an enabled state and is not based on the first gain when the operational state of the first amplifying circuit is a disabled state. Also, the control signal generator delays switching the value of the output control signal in response to a switching of a value of the input control signal so that noise generated when the value of the input control signal switches does not influence the oscillating output signal.

22 Claims, 10 Drawing Sheets

OSCILLATOR CIRCUIT HAVING SWITCHED GAIN AMPLIFIERS AND A CIRCUIT FOR PREVENTING SWITCHING NOISE

FIELD OF THE INVENTION

The present invention relates to an oscillator circuit of a semiconductor device. More particularly, the present invention relates to an oscillator circuit containing a noise prevention circuit.

BACKGROUND OF THE INVENTION

Typically, when a power supply is initially turned on to supply power to a circuit, the voltage level of the power from the power supply is unstable. For example, if the power supply is designed to supply a 5 V signal, the actual voltage may be too low and may fluctuate too much to correctly drive the circuit when the power supply is initially activated. Also, in order to provide a stable voltage during the initial period after the power supply is turned on, a stable 12 V signal may be applied to the circuit from an external source until the 5 V signal has stabilized. When a power signal of the power supply (and/or the external source) is applied to drive an oscillator circuit used to generate a clock signal for a semiconductor device, the gain of the oscillator circuit is dependent upon the voltage of power signal. Therefore, oscillator circuits incorporate amplifying circuits which vary the gain of the circuit so that the gain of the circuits change based on the voltage of the power signal. As a result, an adequate clock signal can be output from the oscillator circuits as soon as possible.

FIG. 12 is a circuit diagram of a conventional oscillator circuit utilized in semiconductor devices. As shown in the figure, the oscillator circuit comprises a feedback resistor 1, a quartz oscillator 3, capacitors 4 and 5, an amplifying unit containing first and second amplifying circuits 21 and 22, a Schmitt trigger circuit 23, and an inverter 24.

The first amplifying circuit 21 comprises first and second P-channel MOS field-effect transistors ("P-type transistors") P1 and P2 and first and second N-channel MOS field-effect transistors ("N-type transistors") N1 and N2. The transistors P1, P2, N1, and N2 are sequentially connected in series between the supply voltage $V_{CC}$ and ground. The second amplifying circuit 22 comprises a third P-type transistor P3 and a third N-type transistor N3 which are also connected in series between the supply voltage $V_{CC}$ and ground.

The feedback resistor 1 and the quartz oscillator 3 are connected between the gates of the transistors P2 and N1 (i.e. the input terminal) and the drains of the transistors P2 and N1 (i.e the output terminal) of the first amplifying circuit 21. Also, the resistor 1 and oscillator 3 are connected to the gates of the transistors P3 and N3 (i.e. the input terminal) and the drains of transistors P3 and N3 (i.e. the output terminal) of the second amplifying circuit 22.

The inverter 24 inputs a gain control signal GAIN1 and inverts such signal GAIN1 to produce an inverted gain control signal GAIN1*. The gain control signal GAIN1 is supplied to the gate of the first P-type transistor P1, and the inverted gain control signal GAIN1* is supplied to the gate of the second N-type transistor N2. Also, the Schmitt trigger circuit 23 is connected to the drains of the transistors P2 and N1 of the first amplifyirg circuit 21 and the drains of the transistors P3 and N3 of the second amplifying circuit 22.

As shown by the above configuration, the oscillator 3 generates an oscillation signal X1, and the signal X1 is supplied to the gates of the transistors P2 and N1 of the first amplifying circuit 21 and to the gates of the transistors P3 and N3 of the second amplifying circuit 22. The first amplifying circuit 21 amplifies the signal X1 based on the gate control signal GAIN1. Specifically, when the signal GAIN1 equals "L", the inverter 24 inverts such signal GAIN1 to produce an inverted gain control signal GAIN1* which equals "H". Accordingly, the gain control signal GAIN1 turns ON the first P-type transistor P1, the inverted gain control signal GAIN1* turns ON the N-type transistor N2, and the first amplifying circuit 21 is enabled.

Since the transistors P3 and N3 of the second amplifying circuit are directly connected between the supply voltage $V_{CC}$ and ground, they are always enabled. Therefore, the oscillation signal X1 is amplified based on the gain of both the first and second amplifying circuits 21 and 22 to produce the output signal X2.

On the other hand, when the gain control signal GAIN1 equals "H", the inverted gain control signal GAIN1* equals "L". Thus, the P-type transistor P1 and the N-type transistor N2 are both turned OFF, and the oscillation signal X1 is amplified based on only the gain of the second amplifying circuit 22 to produce the output signal X2.

The output signal X2 is fed back via the feedback resistor 1 and input again to the amplifying circuits 21 and 22. As a result the signal X2 is amplified again to produce a new amplified signal X2. The output signal X2 is also output to the Schmitt trigger circuit 23, and the circuit 23 shapes the waveform of the output signal X2 to produce a clock signal X0. The clock signal X0 is then supplied to a microcomputer (not shown) to synchronize the operations of the microcomputer.

When the power supply $V_{CC}$ for the oscillator circuit is initially turned ON, the gain signal GAIN1 equals "L". Therefore, the first amplifying circuit 21 is enabled, and both circuits 21 and 22 amplify the oscillation signal X1 to produce the output signal X2. Also, the output signal X2 is fed back to the amplifying circuits 21 and 22 to be amplified again so that the oscillation continues. The Schmitt trigger circuit 23 inputs the signal X2 and outputs the corresponding clock signal X0. After the oscillating operation of the oscillator circuit becomes stable, the gain control signal GAIN1 is set to equal "H", and the first amplifying circuit 21 is disabled. As a result, the gain of the amplifying unit of the oscillator circuit is reduced. In other words, only the second amplifying circuit 22 continues to amplify the signal X1 to continue the oscillation operation in conjunction with the quartz oscillator 3. As shown above, the gain of the amplifying unit of the oscillation circuit can be changed in accordance with the value of the control signal GAIN1.

FIG. 13 is a circuit diagram of another conventional oscillating circuit which is disclosed in Japanese Laid-Open Patent Application No. 3-76404. The oscillating circuit is initially supplied with a 12 V signal from an external source until a 5 V signal from a power supply stabilizes. Afterwards, the circuit is supplied with the 5 V signal. Therefore, the amplifying Circuits are initially controlled to have a high gain which incrementally decreases as the 5 V signal becomes more stable.

As shown in the figure, the oscillation circuit comprises a feedback resistor 1, a quartz oscillator 3, capacitors 4 and 5, a power supply voltage detecting circuit 12, a multiplexer 13, a time detecting circuit 14, an amplifying unit 15, and an inverter 24.

The amplifying unit 15 contains first to fourth amplifying circuits. The first amplifying circuit includes P-type transistors 8a and 9a and N-type transistors 10a and 11a, and the transistors 8a, 9a, 10a, and 11a are sequentially connected in series between the supply voltage $V_{CC}$ and ground. The second amplifying circuit includes P-type transistors 8b and 9b and N-type transistors 10b and 11b, and the transistors 8b, 9b, 10b, and 11b are sequentially connected in series between the supply voltage $V_{CC}$ and ground. The third amplifying circuit includes P-type transistors 8c and 9c and N-type transistors 10c and 11c, and the transistors 8c, 9c, 10c, and 11c are sequentially connected in series between the supply voltage $V_{CC}$ and ground. Finally, the fourth amplifying circuit contains P-type transistors 8d and 9d and N-type transistors 10d and 11d, and transistors 8d, 9d, 10d, and 11d are sequentially connected in series between the supply voltage $V_{CC}$ and ground.

The power supply voltage detecting circuit 12 detects the level of the power supply voltage $V_{CC}$ output from the power supply and generates four detection signals Q1 to Q4 based on such level. When the power supply is initially turned ON and the oscillator circuit begins generating the output signal X2, the voltage $V_{CC}$ of the power supply is initially high and gradually decreases to a constant voltage $V_{CC}$. As a result, the power supply voltage detecting circuit 12 initially outputs the detection signal Q1, sequentially outputs the signals Q1 and Q2 and the signals Q1, Q2, and Q3 as the voltage $V_{CC}$ decreases, and finally outputs the signals Q1, Q2, Q3, and Q4 when the voltage $V_{CC}$ becomes constant.

The time detecting circuit 14 detects the amount of time that has elapsed since power was first supplied to the oscillation circuit and outputs detection signals Y1 to Y4 based on the elapsed time. In particular, when the power is first supplied, the timing detecting circuit 14 outputs the signal Y1. Then, as time elapses, the detecting circuit 14 outputs the signals Y1 and Y2 followed by the signals Y1, Y2, and Y3. Finally, after a certain period of time has elapsed, the time detecting circuit 14 outputs the signals Y1, Y2, Y3, and Y4.

The multiplexer 13 inputs the detection signals Q1 to Q4 and the detection signals Y1 to Y4 and outputs corresponding control signals Z1 to Z4. Specifically, as the power supply voltage $V_{CC}$ decreases and/or time passes, the multiplexer 13 sequentially outputs the signal Z1, the signals Z1 and Z2, the signals Z1, Z2, and Z3, and the signals Z1, Z2, Z3, and Z4. The first amplifying circuit is enabled by the control signal Z1, the second amplifying circuit is enabled by the control signal Z2, the third amplifying circuit is enabled by the control signal Z3, and the fourth amplifying circuit is enabled by the control signal Z4.

When the first amplifying circuit is enabled, the gain of the circuit can be represented by the sum of the gain of the P-type transistors 8a and 9a (i.e. βp1) and the sum of the gain of the N-type transistors 10a and 11a (i.e. βn1). When the second amplifying circuit is enabled, the gain of the circuit can be represented by the sum of the gain of the P-type transistors 8b and 9b (i.e. βp2) and the sum of the gain of the N-type transistors 10b and 11b (i.e. βn2). When the third amplifying circuit is enabled, the gain of the circuit can be represented by the sum of the gain of the P-type transistors 8c and 9c (i.e. βp3) and the sum of the gain of the N-type transistors 10c and 11c (i.e. βn3). Finally, when the fourth amplifying circuit is enabled, the gain of the circuit can be represented by the sum of the gain of the P-type transistors 8d and 9d (i.e. βp4) and the sum of the gain of the N-type transistors 10d and 11d (i.e. βn4).

Therefore, when power is initially supplied to the oscillation circuit and causes it to begin oscillating, the multiplexer 13 outputs only the signal Z1. Accordingly, only the first amplifying circuit is enabled, and thus, the gain of the entire amplifying unit 15 equals βp1 on the P-channel side and βn1 on the N-channel side. Then, the multiplexer 13 outputs only the signals Z1 and Z2, and the first and second amplifying circuits are enabled. As a result, the gain of the entire amplifying unit 15 is increased to βp1+βp2 on the P-channel side and βn1+βn2 oil the N-channel side. Afterwards, the multiplexer 13 outputs the signals Z1, Z2, and Z3, and the first, second, and third amplifying circuits are enabled. Therefore, the gain of the entire amplifying unit 15 is further increased to βp1+βp2+βp3 on the P-channel side and βn1+βn2+βn3 on the N-channel side. Finally, the multiplexer 13 outputs all of the control signals Z1, Z2, Z3, and Z4 and the first, second, third, and fourth amplifying circuits are enabled. Therefore, the gain of the entire amplifying unit 15 is maximized and equals βp1+βp2+βp3+βp4 on the P-channel side and βn1+βn2+βn3+βn4 on the N-channel side.

Based on the operation above, the oscillation signal X1 is input to the amplifying unit 15 and amplified in accordance with the control signals Z1 to Z4 to produce the output signal X2. Then, the waveform of the output signal X2 is shaped by a Schmitt trigger circuit (not shown) to produce a clock signal which is used to synchronize the operations of a digital device (e.g. a microcomputer).

As shown above, the gains of the amplifying units of the conventional oscillator circuits can be selectively switched in accordance with one or more control signals. However, when the conventional oscillator circuits are employed in a semiconductor device (e.g. a microcomputer), various problems arise.

For example, when the gain of the amplifying unit is excessively high, a excessive amount of current is consumed. For example, in the amplifying circuits 21 and 22 shown in FIG. 12, a portion of the current which is supplied from the power supply (i.e. $I_{VDD}$) is output from the circuits 21 and 22 as the current (i.e. $I_{X2}$) of the output signal X2, and a portion of the current $I_{VDD}$ passes through the amplifying circuits to ground as a ground current (i.e. $I_{GND}$). In other words, $I_{VDD}=I_{X2}+I_{GND}$. When the gain increases, a greater amount of current $I_{X2}$ is output from the amplifying circuits 21 and 22, and thus, the greater amount of current $I_{VDD}$ is drawn from the power supply. As a result, a greater amount of current $I_{GND}$ is supplied to ground, and the amount of power consumed by the circuits 21 and 22 is unnecessarily high.

Also, when the gain of the amplifying circuits 21 and 22 is improperly shifted to another gain (e.g. when the voltage of the power supply increases), the oscillator circuit may oscillate at other frequencies other than its preselected oscillation frequency f. For example, the oscillator circuit may be designed to oscillate at a resonant frequency f but may also oscillate at higher level harmonics (e.g. 3 f and 5 f) depending on the gain of the amplifying circuits. Thus, if the gain of the amplifying circuits is excessively high, for example, the oscillator may oscillate at an incorrect frequency 3 f or 5 f.

Also, when the gain is high, an output signal having a frequency f is clamped by the transistors within the amplifying circuits to $V_{DD}$, and thus, the output of the amplifying circuits resembles a pulse signal. Also, the pulse signal generates higher level harmonic signals which resonate at 3 f and 5 f. Thus, if the oscillator circuit is designed to resonate at 16 MHz (i.e. f), a noise which has a frequency of 80 MHz (i.e. 5 f) may be generated, and such noise has a frequency which interferes with radio receivers.

On the other hand, when the gain of the amplifying unit becomes excessively low, the oscillating operation of the circuit is frequently interrupted, and thus, the circuit outputs an erroneous clock signal.

Also, in a general-purpose semiconductor device such as a microcomputer, an oscillator circuit is typically used with a wide range of power supply voltages and over a wide range of oscillation frequencies. Thus, the circuit may be required to periodically switch among the different gains of the amplifying unit in response to the varying supply voltages and frequencies.

However, when the gains of the amplifying unit are switched, noise is produced in the oscillator circuit. Thus, if the gains are switched during the operation of the microcomputer, an erroneous clock signal is output, and the microcomputer or the devices controlled by the microcomputer malfunction. As a result, when the gains are switched in a conventional oscillation circuit, they must be switched when the operation of the microcomputer is paused.

An example of how an erroneous clock signal is generated by the conventional circuit shown in FIG. 12 will be described below in conjunction with FIG. 14. The figure illustrates the waveforms of the output signal X2 (FIG. 14(*a*)) output from the amplifying unit, the ideal gain control signal GAIN1 (FIG. 14(*b*)), the ideal inverted gain control signal GAIN1* (FIG. 14(*c*)), the clock signal X0 (FIG. 14(*d*)) output from the Schmitt trigger circuit 23, the actual gain control signal GAIN1 (FIG. 14(*e*)), and the actual inverted gain control signal GAIN1* (FIG. 14(*f*)). (Please note that the change in amplitude of the signal X2 die to the change in the gain is not shown in FIG. 14(*a*) for the sake of clarity). As shown in the figure, whenever the voltage of the output signal X2 rises above an upper threshold voltage S1 of the Schmitt trigger circuit 23, the circuit outputs an "H" as the clock signal X0. On the other hand, whenever the voltage of the signal X2 drops below a lower threshold voltage S2 of the circuit 23, an "L" is output as the clock signal X0. Therefore, since the output signal X2 is sinusoidal, the circuit 23 outputs a square wave clock signal X0.

As shown in the figure, the gain of the amplifier unit is switched at the time (1) when the value of the gain control signal GAIN1 changes from "L" to "H". When the gain is switched, a noise "a" is generated in the output signal X2, and thus, the voltage of the signal X2 erroneously rises above the upper threshold S1 of the circuit 23. As a result, the noise "a" is output by the Schmitt trigger circuit 23 as a noise "b" in the clock signal X0, and a microcomputer synchronized by the clock signal X0 may malfunction. Also, as shown in FIG. 14(*e*), the actual gain control signal GAIN1 does not immediately switch from "L" to "H", but changes from "L" to "H" over some time period. Also, as shown in FIG. 14(*f*), the actual inverted gain control signal GAIN1* switches from "H" to "L" a short time $t_D$ after the actual signal GAIN1 changes due to the delay of the inverter 24. Therefore, the P-type transistor P1 turns OFF slightly before the N-type transistor N2 turns OFF. Thus, during the period $t_D$ when the N-type transistor N2 is ON and the P-type transistor P1 is OFF, the transistor N2 substantially pulls the voltage of the signal X2 down below the threshold S2. Thus, an additional and erroneous pulse in the clock signal X0 output from the Schmitt trigger 23 is generated.

SUMMARY OF THE INVENTION

An object of the present invention is to prevent errors from occurring when the gain of the oscillator circuit is switched.

In order to achieve the above and other objects, an oscillator circuit is provided. The oscillator circuit comprises: an amplifying unit containing a first amplifying circuit having a first gain and a second amplifying circuit having a second gain connected in parallel, wherein said amplifying unit inputs an oscillating input signal and amplifies said oscillating input signal in accordance with an overall gain of said amplifier unit to produce an oscillating output signal; and a first control signal generator which is coupled to said amplifying unit, wherein said first control signal generator inputs a first input control signal and generates a corresponding first output control signal, wherein an operational state of said first amplifying circuit is switched when a value of said first output control signal switches, wherein said overall gain is based on said first gain when said first operational state of said first amplifying circuit is an enabled state and is not based on said first gain when said operational state of said first amplifying circuit is a disabled state, and wherein said first control signal generator delays switching said value of said first output control signal in response to a switching of a value of said first input control signal so that noise generated when said value of said first input control signal switches does not influence said oscillating output signal.

In order to further achieve the above and other objects, an oscillator circuit is provided. The oscillator circuit comprises: an amplifying unit containing a first amplifying circuit having a first gain and a second amplifying circuit having a second gain connected in parallel, wherein said amplifying unit inputs an oscillating input signal and amplifies said oscillating input signal in accordance with an overall gain of said amplifier unit to produce an oscillating output signal; and a first control signal generator which is coupled to said amplifying unit, wherein said first control signal generator inputs a first input control signal and generates a corresponding first output control signal, wherein said first amplifying circuit is in an enabled state when said first output control signal has a first control signal value and is in a disabled state when said first output control signal has a second control signal value, wherein said overall gain is based on said first gain when said first operational state of said first amplifying circuit is said enabled state and is not based on said first gain when said operational state of said first amplifying circuit is said disabled state, wherein said first gain varies in accordance with a changing value of said first output control signal when said changing value varies between said first control signal value and said second control signal value, and wherein said first control signal generator gradually changes said changing value of said first output control signal from said first control signal value to said second control signal value when a value of said first input control signal switches from a first value to a second value in order to gradually vary said first gain.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

The following description of the preferred embodiments discloses specific configurations, components, and values. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, components, and values of the present invention which would have been known to one skilled in the art are omitted for the sake of clarity and brevity.

Figure 1:
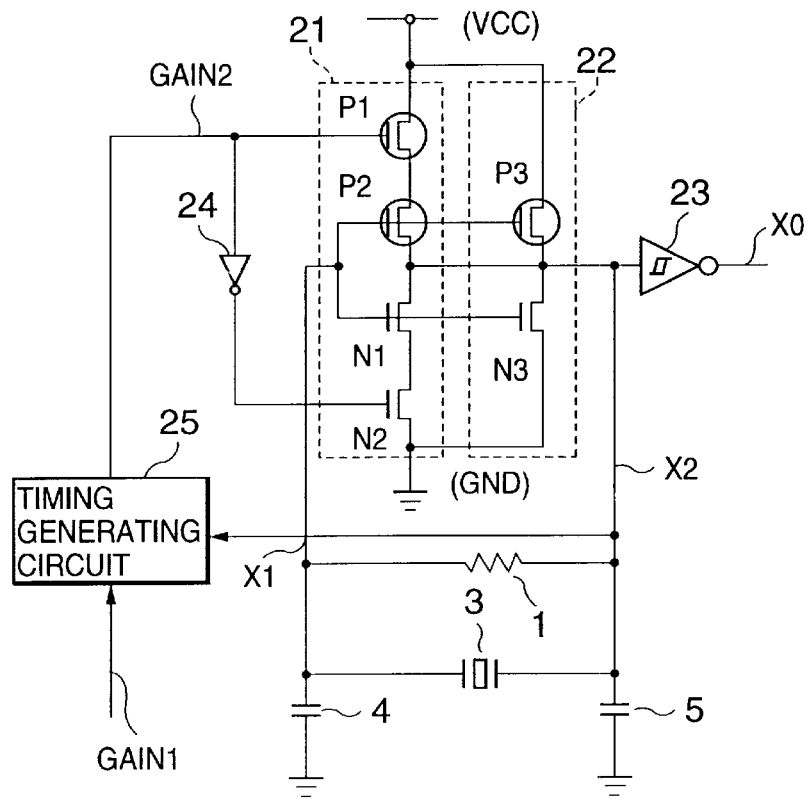
FIG. 1 is a circuit diagram of an oscillator circuit according to a first embodiment of the present invention.

FIG. 1 illustrates a circuit diagram of an oscillator circuit according to a first Embodiment of the present invention. In the oscillator circuit, a power supply voltage $V_{CC}$ which equals 1.8 to 5V is supplied to the circuit to enable it to generate an oscillation signal.

As shown in the figure, the oscillator circuit comprises a feedback resistor 1, a quartz oscillator 3, capacitors 4 and 5, an amplifying unit containing first and second amplifying circuits 21 and 22, a Schmitt trigger circuit 23, an inverter 24, and a timing generating circuit 25.

The first amplifying circuit 21 comprises first and second P-type transistors P1 and P2 and first and second N-type transistors N1 and N2. The transistors P1, P2, N1, and N2 are sequentially connected in series between the supply voltage $V_{CC}$ and ground. The second amplifying circuit 22 comprises a third P-type transistor P3 and a third N-type transistor P3 which are also connected in series between the supply voltage $V_{CC}$ and ground.

The feedback resistor 1 and the quartz oscillator 3 are connected between the gates of the transistors P2 and N1 (i.e. the input terminal) and the drains of the transistors P2 and N1 (i.e the output terminal) of the first amplifying circuit 21. Also, the resistor 1 and oscillator 3 are connected to the gates of the transistors P3 and N3 (i.e., the input terminal) and the drains of transistors P3 and N3 (i.e. the output terminal) of the second amplifying circuit 22. Also, the Schmitt trigger circuit 23 is connected to the drains of the transistors P2 and N1 of the first amplifying circuit 21 and the drains of the transistors P3 and N3 of the second amplifying circuit 22.

The timing generating circuit 25 inputs a first gain control signal GAIN1 and an output signal X2 and processes is such signals GAIN1 and X2 to produce a second gain control signal GAIN2. The inverter 24 inputs the second gain control signal GAIN2 and inverts such signal GAIN2 to produce an inverted gain control signal GAIN2*. The gain control signal GAIN2 is supplied to the gates of the first P-type transistor P1, and the inverted gain control signal GAIN2* is supplied to the gate of the second N-type transistor N2.

As shown by the above configuration, the quartz oscillator 3 generates an oscillation signal X1, and the signal is supplied to the gates of the transistors P2 and N1 of the first amplifying circuit 21 and to the gates of the transistors P3 and N3 of the second amplifying circuit 22. Thus, the first amplifying circuit 21 indirectly amplifies the signal X1 based on the gate control signal GAIN1. Specifically, when the signal GAIN1 is input to the timing generating circuit 25, the circuit 25 outputs the corresponding signal GAIN2.

If the signal GAIN2 equals "L", the inverter 24 inverts such signal GAIN2 to produce an inverted gain control signal GAIN2* which equals "H". Accordingly, the gain control signal GAIN2 turns ON the first P-type transistor P1, and the inverted gain control signal GAIN2* turns ON the N-type transistor N2. Also, since the transistors P3 and N3 of the second amplifying circuit 22 are directly connected between the supply voltage $V_{CC}$ and ground, they are always enabled. Therefore, the oscillation signal X1 is amplified based on the gain of both the first and second amplifying circuits 21 and 22 to produce the output signal X2.

On the other hand, when the gain control signal GAIN2 equals "H", the inverted gain control signal GAIN2* equals "L". Thus, the P-type transistor P1 and the N-type transistor N2 are both turned OFF. Therefore, the first amplifying circuit 21 is not enabled, and the transistors P2 and N1 do not amplify the oscillation signal X1. As a result, only the transistors P3 and N3 of the second amplifying circuit 22 amplify the oscillation signal to produce the output signal X2.

The output signal X2 is fed back via the feedback resistor 1 and input to the amplifying circuits 21 and 22. As a result the signal X2 is amplified again to produce a new amplified signal X2. The output signal X2 is also output to the Schmitt trigger circuit 23, and the circuit 23 shapes the waveform of the output signal X2 to produce a clock signal X0. The clock signal X0 is then supplied to a microcomputer (not shown) to synchronize the operations of the microcomputer.

When a gain control signal GAIN1 equaling "H" is output to the timing generating circuit 25, the circuit 25 subsequently outputs a gain control signal GAIN2 equaling "H". Therefore, the transistor P1 is turned OFF by the signal GAIN2, and the transistor N2 is turned OFF by the inverted gain control signal GAIN2*. As a result, the first amplifying circuit 21 is disabled, the second amplifying circuit 22 is enabled, and the oscillator circuit oscillates based on the gain of only the amplifying circuit 22.

On the other hand, when a gain control signal GAIN1 equaling "L" is output to the timing generating circuit 25, the circuit 25 subsequently outputs a gain control signal GAIN2 equaling "L". As a result, the transistor P1 is turned ON by the signal GAIN2, and the transistor N2 is turned ON by the inverted gain control signal GAIN2*. Thus, the first amplifying circuit 21 is enabled, and the oscillator circuit oscillates based on the gain of both the amplifying circuits 21 and 22.

Figure 2:
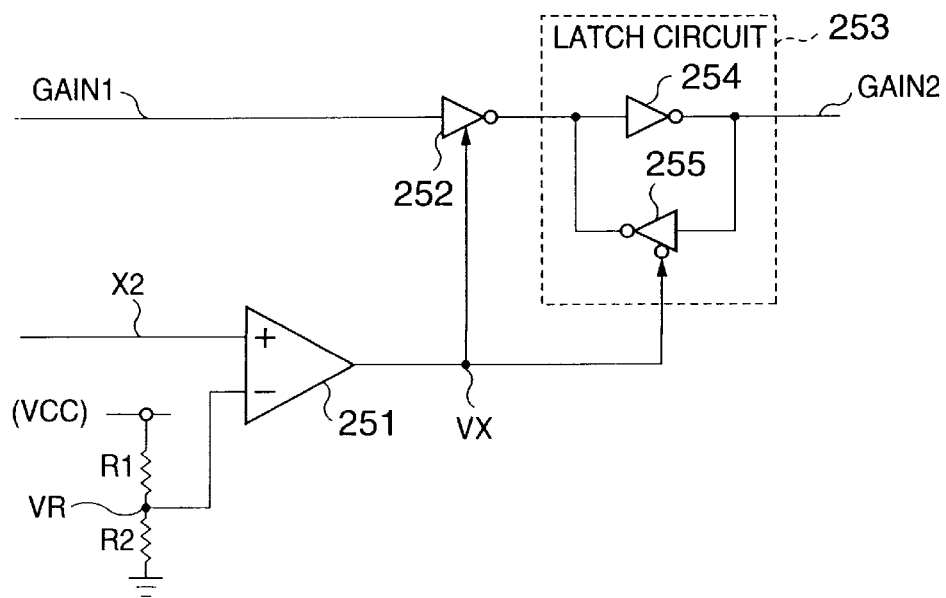
FIG. 2 is a circuit diagram of a timing generating circuit shown in FIG. 1.

FIG. 2 shows an illustrative, non-limiting example of the timing generating circuit 25 shown in FIG. 1. The circuit 25 comprises a comparator 251, an inverter 252, and a latch circuit 253. Also, the latch circuit 253 comprises inverters 254 and 255.

The comparator 251 inputs the output signal X2 from the amplifying unit and a reference voltage VR which is generated by dividing the power supply voltage $V_{CC}$ via a voltage divider containing resistors R1 and R2. The comparator 251 compares the output signal X2 with the reference voltage VR and outputs a pulse signal VX based on the relative values of the two signals X2 and VR. Specifically, the comparator 251 outputs an "H" as the signal VX when the signal X2 is greater than or equal to the reference voltace VR and outputs an "L" as the signal VX when the signal X2 is less than the reference voltage VR.

The inverter 252 is enabled when the pulse signal VX equals "H", and the inverter 255 is enabled when the pulse signal VX equals "L". Therefore, when the signal VX equals "H", the inverter 252 is enabled and inputs the first gain control signal GAIN1 and outputs an inverted gain control signal GAIN1*. Then, the inverter 254 inverts the inverted gain control signal GAIN1* to produce the second gain control signal GAIN2. On the other hand, when the pulse signal VX equals "L", the inverter 252 is disabled, and the inverter 255 is enabled. As a result, the inverters 254 and 255 form the latch circuit 253. Specifically, the inverter 254 outputs the signal GAIN2, and the inverter 255 inverts the signal GAIN2 and outputs an inverted signal GAIN2*. Then, the inverter 254 inverts the signal GAIN2* and continues to output the signal GAIN2.

For example, if the signal GAIN1 equals "L" when the signal VX becomes "H", the inverter 252 outputs the signal GAIN1* which equals "H", and the inverter 254 outputs the signal GAIN2 which equals "L". Then, if the signal VX becomes "L", the inverter 255 inverts the signal GAIN2 and outputs an inverted signal GAIN2* which equals "H". Then, the inverter 254 inverts the signal GAIN2* to output the signal GAIN2 which equals "L".

Figure 3:
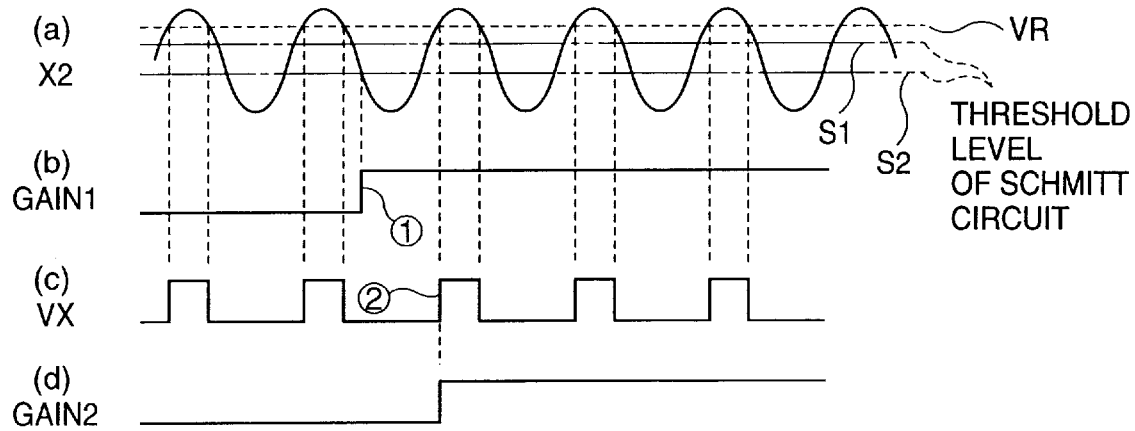
FIG. 3 is a waveform diagram of signals at various locations of the circuits shown in FIGS. 1 and 2.

FIG. 3 is a waveform diagram of the various signals generated and processed by the timing generating circuit 25 when the gain of the amplifying unit is switched in accordance with the signals GAIN1 and GAIN2. Specifically, the figure illustrates exemplary waveforms of the output signal X2 (FIG. 3(a)) output from the amplifying unit, the first gain control signal GAIN1 (FIG. 3(b)) input to the timing generating circuit 25, the pulse signal VX (FIG. 3(c)), and the second gain control signal GAIN2 (FIG. 3(d)) output from the circuit 25. (Please note that the change in amplitude of the signal X2 due to the change in the gain is not shown in FIG. 3(a) for the sake of clarity).

As shown in the figure, the output signal X2 is an oscillating sinusoidal wave and rises to a maximum value which is greater than an upper threshold voltage S1 of the Schmitt trigger circuit 23. Also, the signal falls to a minimum value which is less than the lower threshold voltage S2 of the circuit 23. In addition, the voltage of the reference voltage VR input to the comparator 251 is greater than the upper threshold voltage S1 of the circuit 23, and the maximum value of the output signal X2 is greater than the reference voltage VR. As noted above, the value of the reference voltage VR is set to a value which is different than the threshold voltages S1 and S2 of the Schmitt trigger circuit 23 so that the clock signal X0 output from the circuit 23 is not adversely affected by any noise generated when the gain of the amplifying unit is switched. Also, since the comparator 251 outputs an "H" as the pulse signal VX whenever the signal X2 is greater than the voltage VR, the pulse signal VX has the shape of the square wave shown in FIG. 3(c).

As shown in FIG. 3(b), the first gain control signal GAIN1 initially equals "L", and the inverter 252 inverts the control signal GAIN1 when the pulse signal VX equals "H" to produce the inverted control signal GAIN1* which equals "H". Then, the inverted signal GAIN1* is further inverted by the inverter 254 to output the signal GAIN2 which equals "L". When the pulse signal VX equals "L" and the signal GAIN1 equals "L", the inverter 252 is disabled, and the inverter 255 is enabled. Thus, the latch circuit 253 latches and continues to output the second gain control signal GAIN2 which equals "L". Thus, when the gain signal GAIN1 initially equals "L", the gain signal GAIN2 output from the timing generating circuit equals "L".

As a result, the first amplifying circuit 21 is enabled, and the oscillation signal X1 is amplified in accordance with the quartz oscillator 3 and the gain of both of the amplifying circuits 21 and 22 to produce the output signal X2. Then, the output signal X2 is converted into the clock signal X0 by the Schmitt trigger circuit 23 based on the threshold levels S1 and S2 of the circuit 23.

Then, at time (1), the gain signal GAIN1 switches from "L" to "H" to switch the gain of the amplifying unit so that the oscillation signal X1 is only amplified by the second amplifying circuit 22. Since the pulse signal VX equals "L" at such time, the inverter 252 is disabled and does not output the new value "L" of the inverted signal GAIN1*. Therefore, the current value "L" of the signal GAIN2 continues to be output. However, when the pulse signal VX becomes "H" at time (2), the inverter 252 is enabled and outputs the inverted signal GAIN1* having a value "L". As a result, the inverter 254 inverts such signal GAIN1* and outputs the signal GAIN2 having a value "H". Subsequently, when the signal VX equals "L", the latch circuit 253 latches and continues to output the signal GAIN2 which equals "H".

As described above, when the value of the first gain control signal GAIN1 changes to switch the gain of the amplifying unit, the gain of the amplifying unit is not immediately switched. Instead, the gain is switched only when the output signal X2 is greater than both the upper threshold S1 of the Schmitt trigger 23 and the reference voltage VR. As a result, the voltage level of the output signal X2 is so high, that it is not pulled below the lower threshold S2 of the Schmitt trigger 23. Thus, the noise does not create an erroneous pulse in the clock signal X0.

Figure 15:
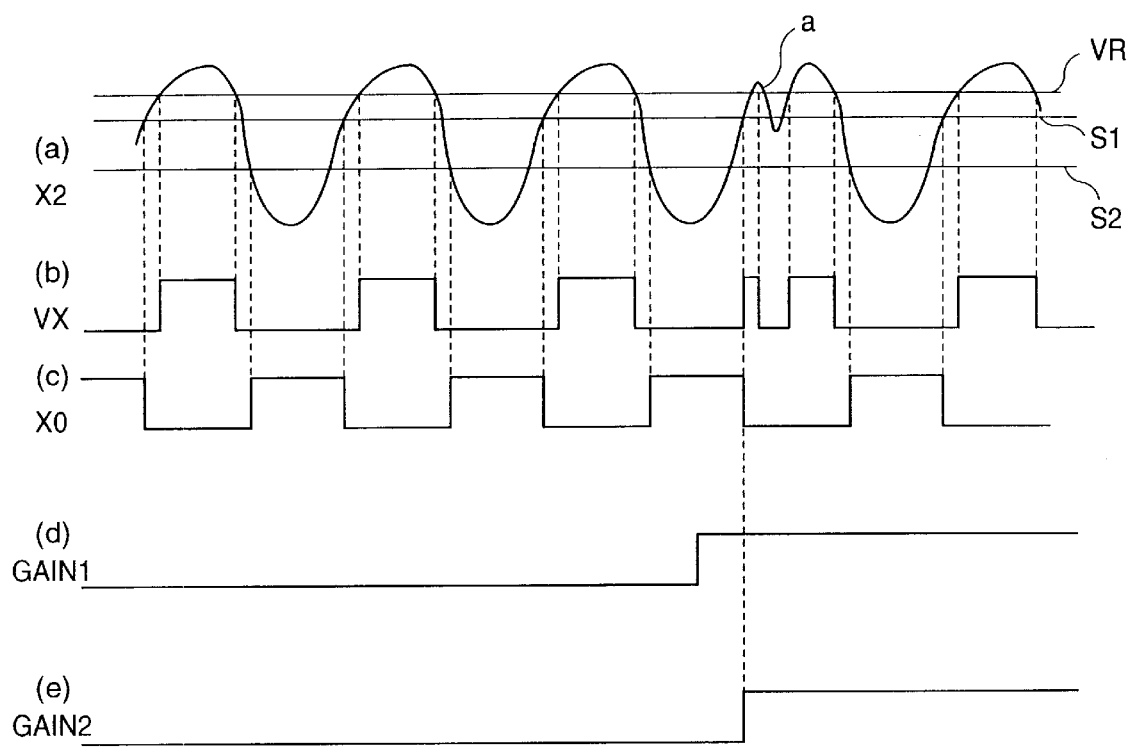
FIG. 15 is a waveform diagram of signals at various locations of the circuits shown in FIGS. 1 and 2.

FIG. 15 shows a more detailed example of a waveform diagram of the various signals; generated and processed by the timing generating circuit 25 when the gain of the amplifying unit is switched in accordance with the signals GAIN1 and GAIN2. The figure illustrates exemplary waveforms of the output signal X2 (FIG. 15(a)) output from the amplifying unit, the pulse signal VX (FIG. 15(b)) output from the comparator 251, the clock signal X0 (FIG. 15(c)) output from the Schmitt trigger circuit 23, the first gain control signal GAIN1 (FIG. 15(d)) input to the timing generating circuit 25, and the second gain control signal GAIN2 (FIG. 15(e)) output from the circuit 25. (Please note that the change in amplitude of the signal X2 due to the change in the gain is not shown in FIG. 15(a) for the sake of clarity). As shown in the waveform diagrams, the signal GAIN2 only switches when the output signal X2 is greater than the reference voltage VR. As a result, any noise "a" created when the signal GAIN2 switches from "L" to "H" is not pulled down by the N-type transistor N2 below the lower threshold S2 of the Schmitt trigger circuit 23, even if the delay of the inverter 24 causes the N-type transistor N2 to be ON for a small period during which the P-type transistor P1 is OFF.

Figure 14:
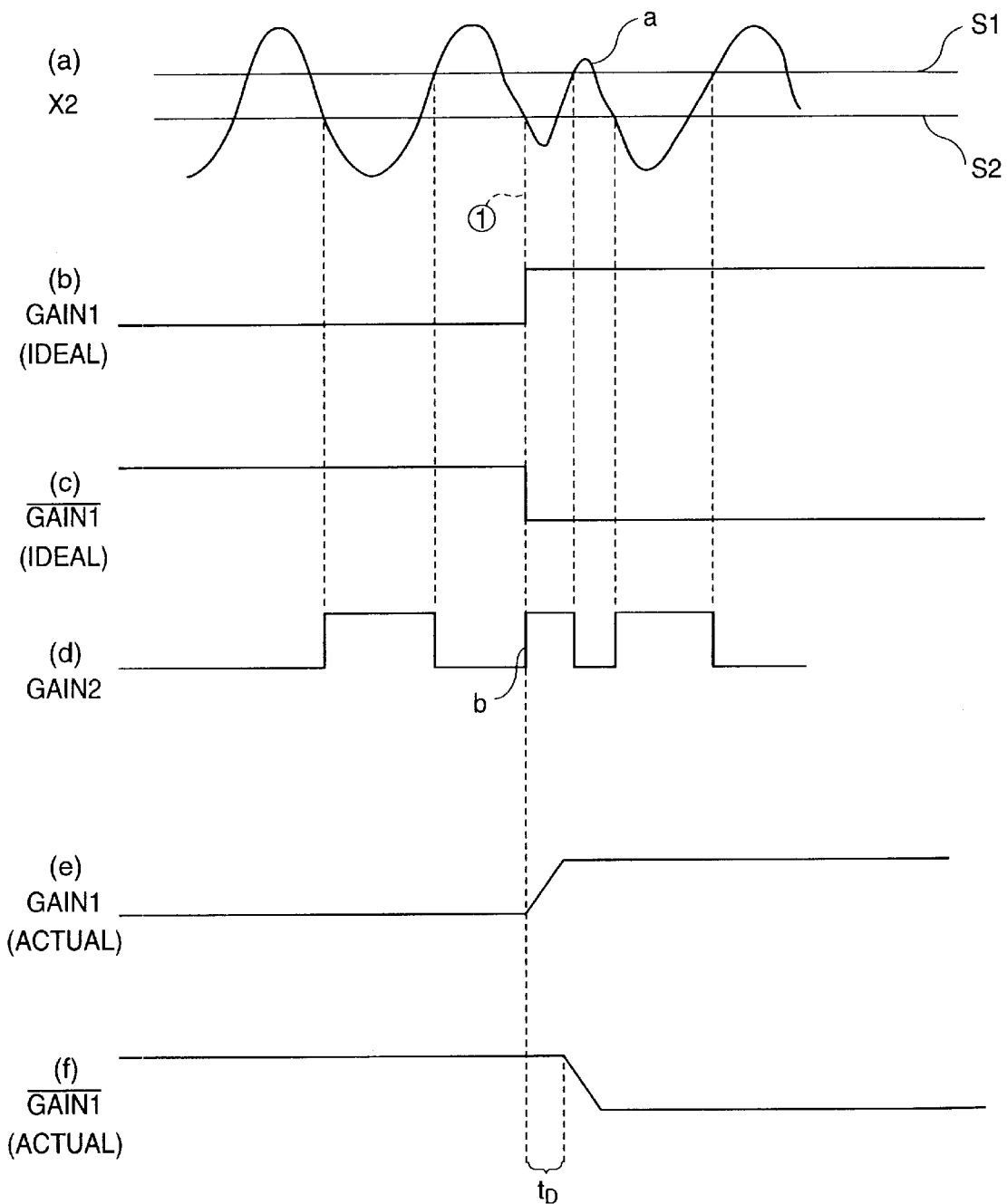
FIG. 14 is a waveform diagram of signals at various locations of the circuit shown in FIG. 12.

On the other hand, as described above in conjunction with FIG. 14, the conventional oscillator circuit produces a noise "a" in the output signal X2 because the amplifying unit is immediately switched when the first gain control signal GAIN1 switches. Thus, in the present embodiment, the oscillation circuit avoids causing the Schmitt trigger circuit 23 from generating the noise "b" in the clock signal X0. Since the clock signal X0 is error free, an apparatus (e.g. a microcomputer) which is synchronized with such signal X0 does not malfunction.

The first embodiment has been described by using an example in which the first gain signal GAIN1 switches from "L" to "H" to reduce the gain of the amplifying unit. Clearly, the embodiment also eliminates noise in the output signal X2 when the gain signal GAIN1 is switches from "H" to "L" to increase the gain of the amplifying unit.

Also, in the first embodiment, the level of the reference voltage VR is set to be higher than the upper threshold level S1 of the Schmitt trigger circuit 23. However, the same result can be achieved when the level of the reference voltage VR is set to be lower than the lower threshold level S2.

Figure 4:
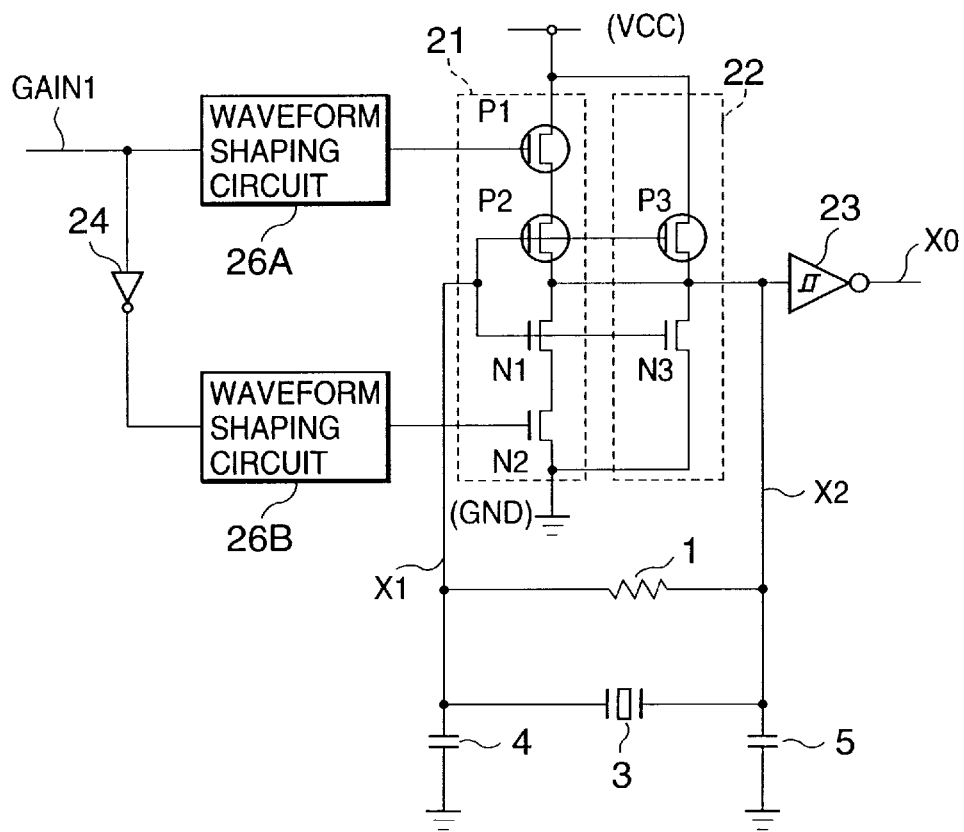
FIG. 4 is a circuit diagram of an oscillator circuit according to a second embodiment of the present invention.

FIG. 4 is a circuit diagram of an oscillator circuit according to a second embodiment of the present invention. The second embodiment is similar to the first embodiment except that waveform shaping circuits 26A and 26B are employed instead of the timing generating circuit 25. As shown in the figure, the first waveform shaping circuit 26A is connected between the input terminal that inputs the first gain control signal GAIN1 and the gate of the transistor P1, and the second waveform shaping circuit 26B is connected between the output terminal of the inverter 24 and the gate of the transistor N2.

After inputting the gain control signal GAIN1, the circuit 26A shapes the waveform the signal GAIN1 to produce a reshaped signal GAIN1' and outputs the signal GAIN1' to the gate of the P-type transistor P1. Also, as in the first embodiment, the inverter 24 inputs the gain control signal GAIN1 and produces an inverted gain signal GAIN1*. Then, the second waveform shaping circuit 26B inputs the inverted signal GAIN1* and outputs a corresponding reshaped signal GAIN1*' to the gate of the N-type transistor N2.

Figure 5:
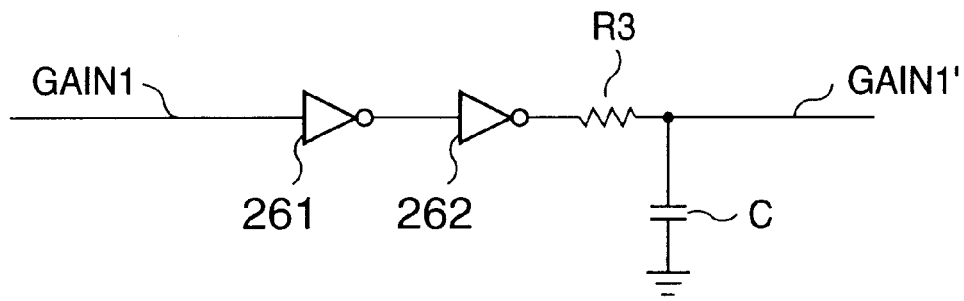
FIG. 5 is a circuit diagram of a waveform shaping circuit shown in FIG. 4.

FIG. 5 shows an illustrative, non-limiting example of the waveform shaping circuit 26A shown in FIG. 4. Since the circuit 26B is similar to the circuit 26A, the description of the waveform shaping circuit 26B is omitted for the sake of brevity.

As shown in FIG. 5, the waveform shaping circuit 26A comprises inverters 261 and 262 and a delay circuit comprising a resistor R3 and a capacitor C. The inverter 261 inputs the gain signal GAIN1 and inverts such signal GAIN1 to produce a first inverted signal. Then, the inverter 262 inputs the first inverted signal and inverts it to produce a second inverted signal which corresponds to the gain signal GAIN1. Then, the delay circuit 263 delays the second inverted signal based on a time constant determined by the values of resistor R3 and the capacitor C to produce the reshaped signal GAIN1'.

Figure 6:
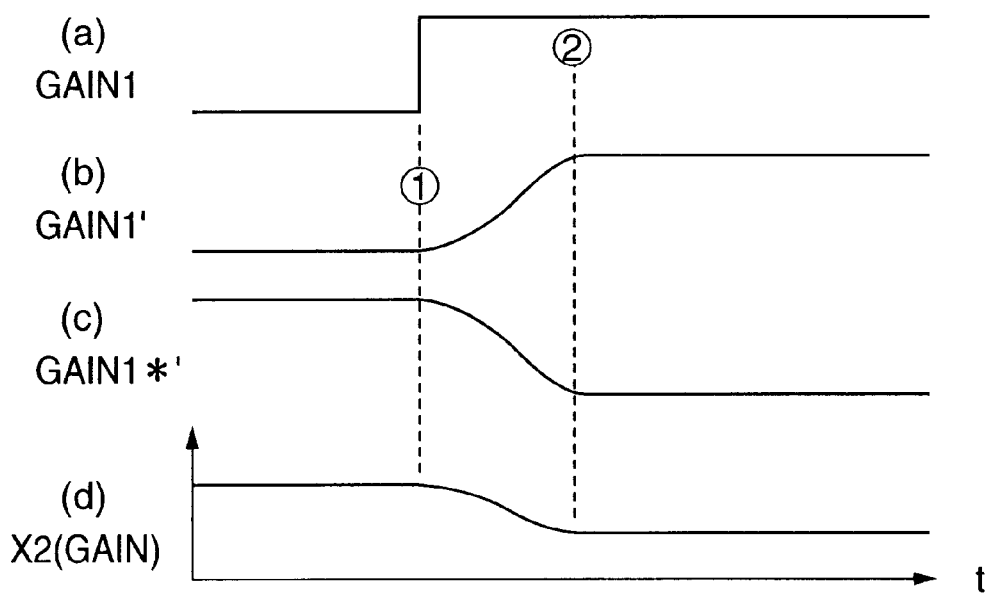
FIG. 6 is a waveform diagram of signals at various locations of the circuit shown in FIG. 4.

FIG. 6 is an waveform diagram of the various signals generated and processed by the waveform shaping circuits 26A and 26B when the gain of the amplifying unit is switched in accordance with the signal GAIN1. Specifically, the figure illustrates exemplary waveforms of the first gain control signal GAIN1 (FIG. 6(a)) input to the waveform shaping circuit 26A, the reshaped signal GAIN1' (FIG. 6(b)) output from the circuit 26A to the transistor P1, and the reshaped signal GAIN1*' (FIG. 6(c)) output from the waveform shaping circuit 26B to the transistor N2. In addition, FIG. 6(d) illustrates a graph of the gain of the output signal X2 with respect to time.

As shown in FIG. 6(a), the gain control signal GAIN1 initially equals "L", and thus, the inverter 24 inverts such signal 24 to produce the inverted gain control signal GAIN1* which equals "H". At the time (1), the gain control signal GAIN1 is switched to equal "H", and thus, the inverted gain control signal GAIN1* is likewise switched to equal "L". At such time (1), in the first waveform shaping circuit 26A, the inverter 261 inverts signal GAIN1 to produce the first inverted signal equalling "L", and the inverter 262 inverts the first inverted signal to produce the second inverted signal equalling "H". Then, the reshaped signal GAIN1' output from the circuit 26A gradually increases from "L" to "H" between the time (1) and the time (2) due to the time constant of the delay circuit R3 and C.

Similarly, the second waveform shaping circuit 26B initially inputs the inverted gain control signal GAIN1* which equals "H". Then, when the inverted signal GAIN1* switches from "H" to "L", the circuit 26B gradually decreases the voltage of the reshaped signal GAIN1*' from "H" to "L" between the time (1) and the time (2).

Since the voltage of the reshaped signal GAIN1' output to the gate of the P-type transistor P1 gradually increases from "L" to "H", the voltage output from the transistor P1 gradually decreases until the transistor P1 turns OFF at the time (2). Also, since the voltage of the reshaped signal GAIN1*' output to the gate of the N-type transistor N2 gradually decreases from "H" to "L", the voltage output from the transistor N2 gradually decreases until the transistor N2 turns OFF at the time (2). As a result, even if the signal GAIN1*' is delayed by a period $t_D$ from the signal GAIN1' due to the delay of the inverter 24, the transistor P1 is not completely OFF when the transistor N2 is completely ON. As a result, the voltage of the signal X2 is not dramatically pulled down when the signal GAIN1 switches from "L" to "H". Thus, the voltage of the signal X2 does not erroneously fall below the lower threshold S2 of the Schmitt trigger circuit 23, and an erroneous pulse is not created in the clock signal X0 output from the circuit 23. Thus, the gain with which the first amplifying circuit 21 amplifies the oscillation signal X1 to produce the output signal X2 gradually decreases to zero. As a result, the overall gain of the amplifying unit is gradually decreased between the times (1) and (2) as the gain of the first amplifying circuit 21 is gradually decreased to zero (FIG. 6 (d)).

As described above, when the value of the gain signal GAIN1 changes to switch the gain of the amplifying unit, the waveform of the gain signal GAIN1 (or the inverted signal GAIN1*) is reshaped by the waveform shaping circuit 26A (or 26B) so that the reshaped signal GAIN1' (or GAIN1*') gradually increases (or decreases) from "L" (or "H") to "H" (or "L"). Therefore, the gain of the amplifying unit is gradually switched. As a result, the noise in the output signal X2 which is typically caused by rapidly switching the gain of the amplifying unit is eliminated, and thus, the clock signal X0 generated in accordance with the signal X2 is error free.

The second embodiment has been described by using an example in which the gain signal GAIN1 switches from "L" to "H" to gradually reduce the gain of the amplifying unit. Clearly, the embodiment also eliminates noise in the output signal X2 when the gain signal GAIN1 is switched from "H" to "L" to gradually increase the gain of the amplifying unit. Also, the rising times or the falling times of the waveform shaping circuits 26A and 26B may be set longer than or equal to the oscillating period of the oscillator circuit.

Figure 7:
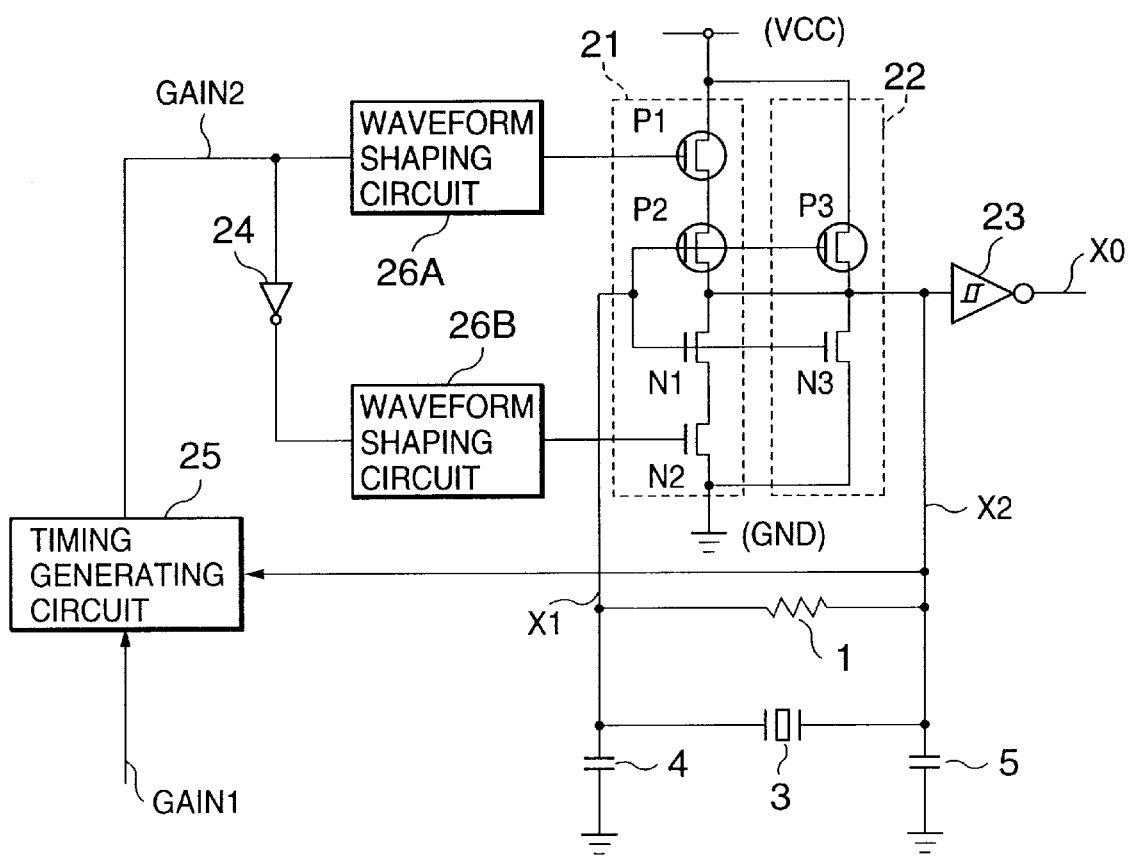
FIG. 7 is a circuit diagram of an oscillator circuit according to a third embodiment of the present invention.

FIG. 7 is a circuit diagram of an oscillator circuit according to a third embodiment of the present invention. The third embodiment combines the advantages of the first and second embodiments by incorporating the timing generating circuit 25 and the waveform shaping circuits 26A and 26B into one circuit.

By incorporating the circuits 25, 26A, and 26B in one oscillator circuit, the amount of noise which can be prevented from affecting the output signal X2 is increased. For instance, if severe noise caused by the switching the gains of the amplifying unit could not be avoided by only outputting the second gain control signal GAIN2 at the particular time (2), the noise can still be avoided by gradually switching the gain of the first amplifying unit. In the embodiment above, the rising times or the falling times of the waveform shaping circuits 26A and 26B are preferably shorter than or equal to ¼ of the oscillating period of the oscillator circuit.

In the first to third embodiments described above, the gain of a single amplifying circuit 21 is switched. However, the present invention also may be used to switch the gains of a plurality of amplifying circuits. Furthermore, in the first to third embodiments, the gain of the second amplifying circuit 22 is not switched. However, the present invention may also be incorporated in an oscillator circuit in which the gain of the final amplifying circuit is switched. Such concepts will be described below in conjunction with FIGS. 8 to 11.

Figure 8:
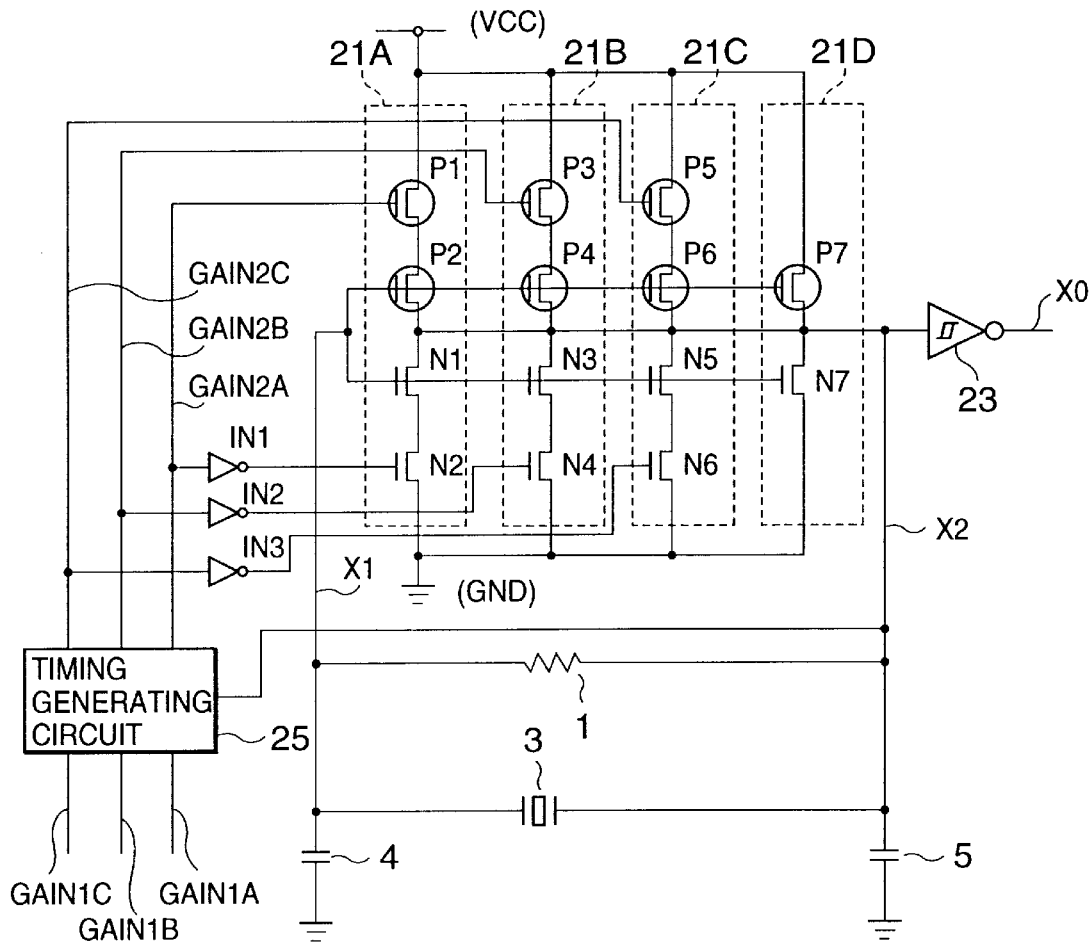
FIG. 8 is a circuit diagram of an oscillator circuit according to a fourth embodiment of the present invention.

FIG. 8 illustrates a circuit diagram of an oscillator circuit in accordance with a fourth embodiment of the present invention. As shown in the figure, the circuit comprises an amplifying unit that contains four amplifying circuits 21A to 21D. Also, the first, second, and third amplifying circuits 21A to 21C are respectively and independently enabled and disabled based on the gain control signals GAIN2A, GAIN2B, and GAIN2C generated by the timing generating circuit 25. By selectively enabling and disabling the amplifying circuits 2A to 2C, the gain of the entire amplifying unit can be changed.

In other words, when the gain control signal GAIN1A is input to the timing generating circuit 25, the circuit 25 outputs a corresponding gain control signal GAIN2A to enable or disable the first amplifying circuit 21A. When the gain control signal GAIN1B is input to the timing generating circuit 25, the circuit 25 outputs a corresponding gain control signal GAIN2B to enable or disable the second amplifying circuit 21B. Finally, when the gain control signal GAIN1C is input to the timing generating circuit 25, the circuit 25 outputs a corresponding gain control signal GAIN2C to enable or disable the third amplifying circuit 21C.

Figure 9:
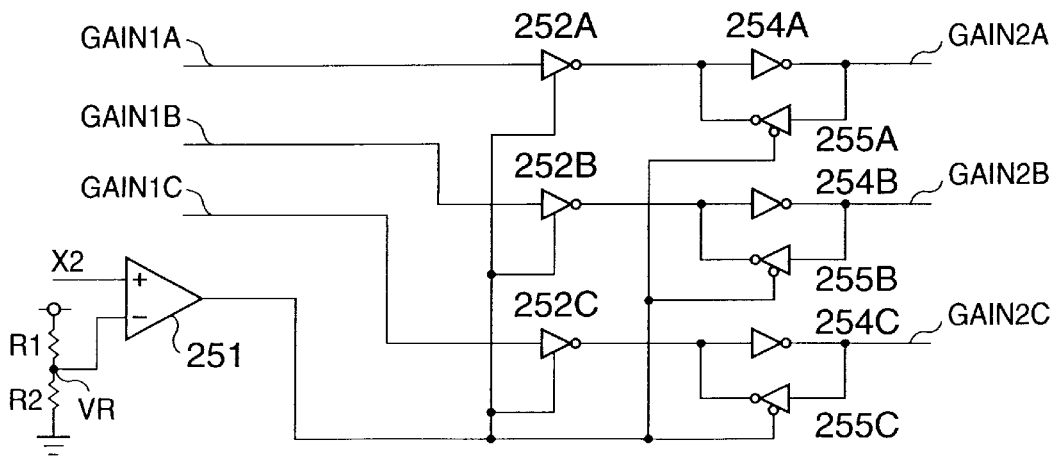
FIG. 9 is a circuit diagram of a timing generating circuit shown in FIG. 8.

FIG. 9 shows an illustrative, non-limiting example of the timing generating circuit 25 shown in FIG. 8. The circuit 25 comprises a comparator 251 and three sub-circuits. The first sub-circuit comprises an inverter 252A and a first latch circuit formed by inverters 254A and 255A. The second sub-circuit comprises an inverter 252B and a second latch circuit formed by inverters 254B and 255B. The third sub-circuit comprises an inverter 252C and a third latch circuit formed by inverters 254C and 255C. Each of the three sub-circuits shown in FIG. 9 operates in a manner which is similar to the operation of the circuit shown in FIG. 2.

The timing generating circuit 25 independently enables and disables the amplifying circuits 21A to 21C by outputting gain control signals GAIN2A to GAIN2C based on the gain signals GAIN1A to GAIN1C. By enabling and disabling the circuits 21A to 2C, the gains of the amplifying unit of the oscillator circuit can be switched.

Figure 10:
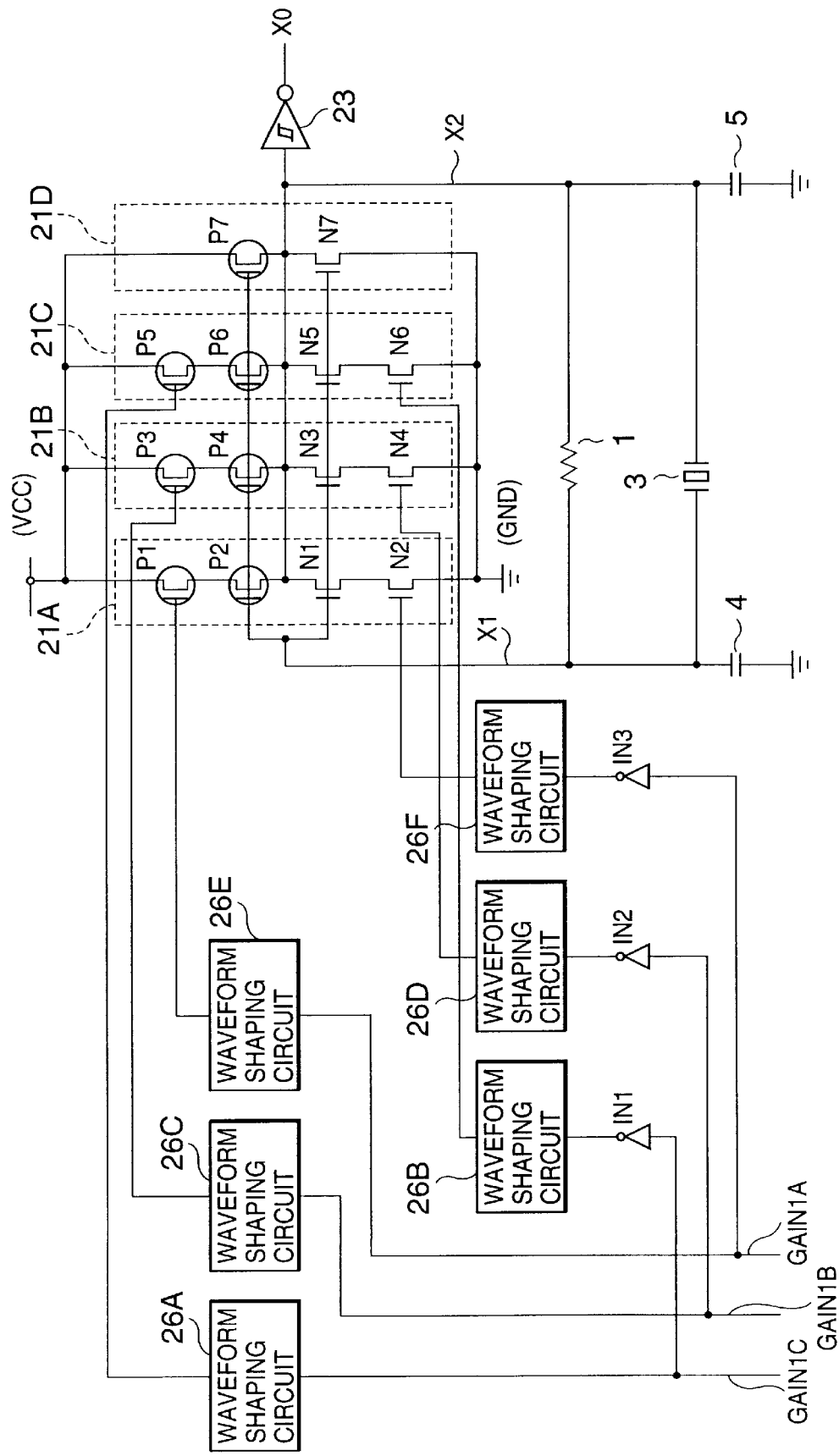
FIG. 10 is a circuit diagram of an oscillator circuit according to a fifth embodiment of the present invention.

FIG. 10 illustrates a circuit diagram of an oscillator circuit according to a fifth embodiment of the present invention. The fifth embodiment is similar to the fourth embodiment except that waveform shaping circuits 26A to 26F are employed instead of the timing generating circuit 25.

As shown in the figure, the first waveform shaping circuit 26E is connected between the input terminal that inputs the gain control signal GAIN1A and the gate of the transistor P1 in the first amplifying circuit 21A. The second waveform shaping circuit 26F is connected between the output terminal of an inverter IN3 and the gate of the transistor N2 of the first amplifying circuit 21A.

After inputting the gain control signal GAIN1A, the circuit 26E shapes the waveform of the signal GAIN1A to produce a reshaped signal GAIN1A' and outputs the signal GAIN1A' to the gate of the transistor P1. Also, the inverter IN3 inputs the gain control signal GAIN1A and produces an inverted gain control signal GAIN1A*. Then, the second waveform shaping circuit 26F inputs the inverted signal GAIN1A* and outputs a corresponding reshaped signal GAIN1A*' to the gate of the transistor N2.

The third and fourth waveform shaping circuits 26C and 26D similarly input the gain control signal GAIN1B and the inverted signal GAIN1B* and output corresponding reshaped signals GAIN1B' and GAIN1B*' to the second amplifying circuit 21B. Also, the fifth and sixth waveform shaping circuits 26A and 26B similarly input the again control signal GAIN1C and the inverted signal GAIN1C* and output corresponding reshaped signals GAIN1C' and GAIN1C*' to the third amplifying circuit 21C.

The configuration of each of the circuits 26A to 26D is similar to the configuration of the waveform shaping circuit shown in FIG. 5. Thus, when the gain control signal GAIN1A switches from a "H" (or "L") to a "L" (or "H"), the waveform shaping circuits 26E and 26F output reshaped signals GAIN1A' and GAIN1A*' which gradually decreases (or increases) the gain of the first amplifying circuit 21A. When the gain control signal GAIN1B switches from a "H" (or "L") to a "L" (or "H"), the waveform shaping circuits 26C and 26D output reshaped signals GAIN1B' and GAIN1B*' which gradually decrease (or increase) the gain of the second amplifying circuit 21B. When the gain control signal GAIN1C switches from a "H" (or "L") to a "L" (or "H"), the waveform shaping circuits 26A and 26B output reshaped signals GAIN1C' and GAIN1C*' which gradually decreases (or increases) the gain of the third amplifying circuit 21C. Also, the waveform shaping circuits 26A to 26E could be incorporated into the embodiment shown in FIG. 8 to produce a circuit similar to the one shown in FIG. 7.

Figure 11:
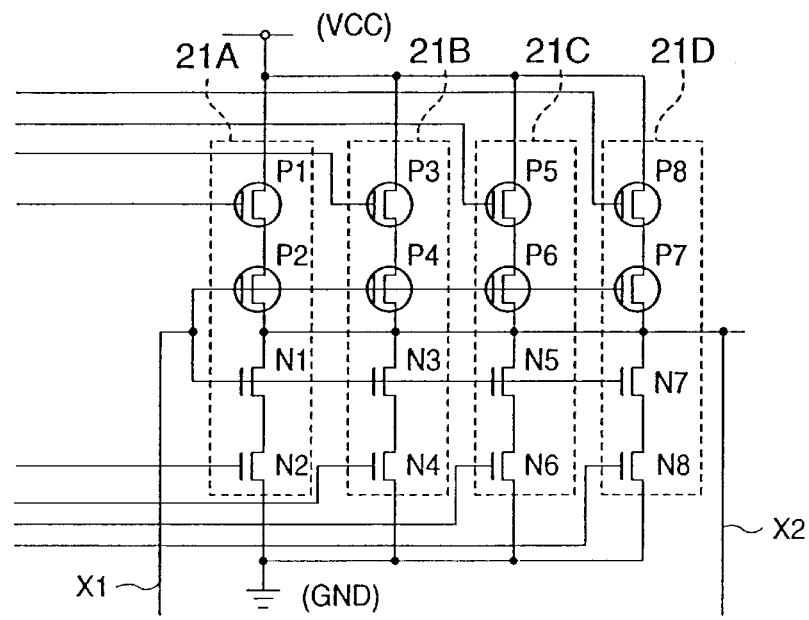
FIG. 11 is a circuit diagram of an oscillator circuit according to a sixth embodiment of the present invention.
Figure 12:
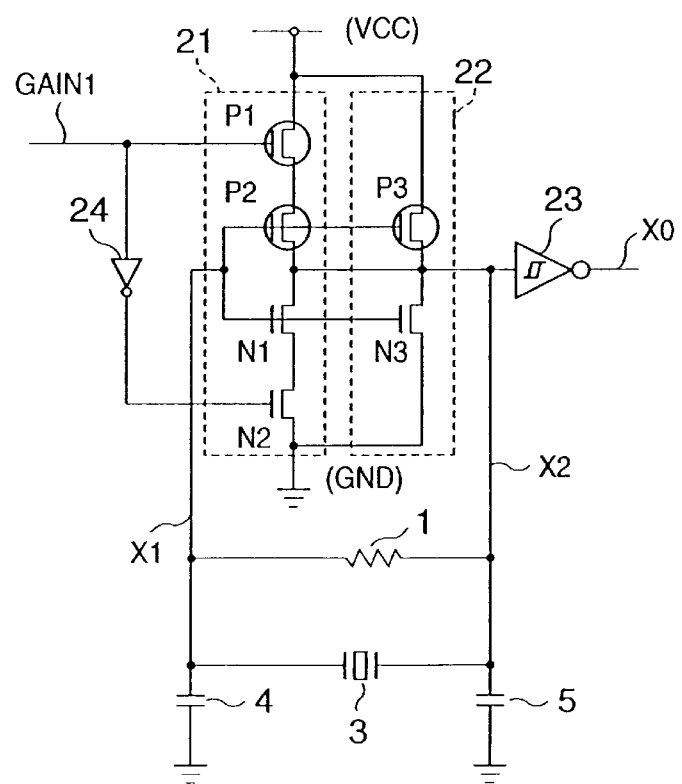
FIG. 12 is a circuit diagram of a first conventional oscillator circuit.
Figure 13:
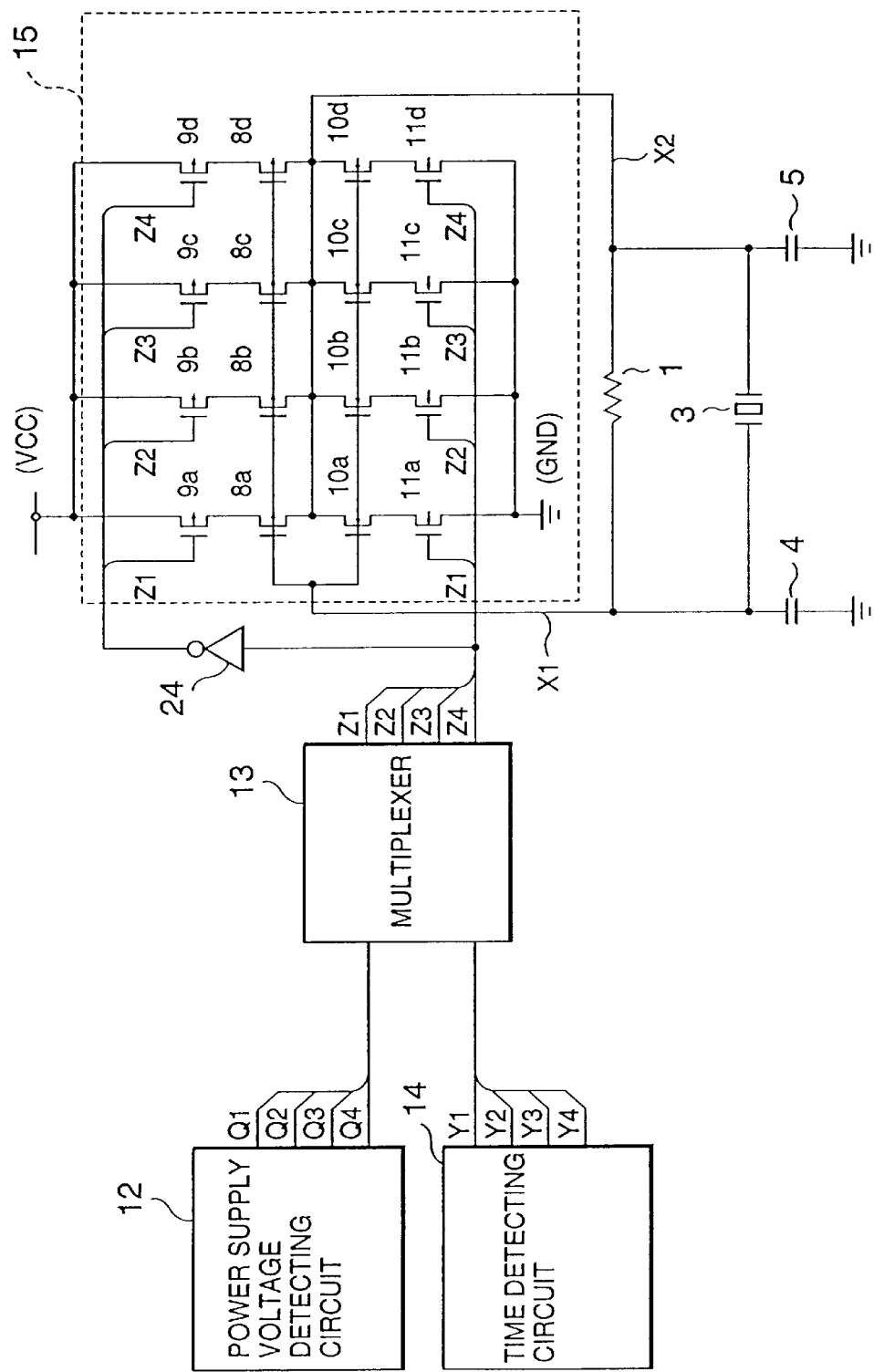
FIG. 13 is a circuit diagram of second conventional oscillator circuit.

FIG. 11 illustrates a circuit diagram of an amplifying unit of oscillator circuit in accordance with a sixth embodiment of the present invention. The amplifying unit of the sixth embodiment is similar to the amplifying units of the fourth and fifth embodiments, except that the fourth amplifying circuit 21D can be selectively enabled and disabled. Specifically, as shown in the figure, the amplifying circuit further comprises a P-type transistor P8 and an N-type transistor N8. The transistor P8 is connected in series between the supply voltage $V_{CC}$ and the transistor P7, and the transistor N8 is connected in series between the transistor N7 and ground. Thus, the amplifying circuit 21D can be enabled and disabled by supplying the appropriate control signals to the gates of the transistors P8 and N8. Such control signals could be generated from circuits which are similar to the timing generating circuit 25 shown in FIG. 8 and/or the waveform shaping circuits 26A to 26E shown in FIG. 10. As a result, the gain of the amplifying unit can be further controlled by switching the gain of the fourth amplifying circuit 21D.

As described above the oscillator circuit of the present invention prevents any noise generated by the switching of the gain of the amplifying unit from influencing the ultimate clock signal supplied to an apparatus (e.g. a microcomputer). Therefore, the present invention prevents the microcomputer from malfunctioning by relying on an erroneous clock signal. One manner in which the present invention prevents noise is by switching the gain of the amplifying circuit when the noise is not produced. Also, the present invention may additionally or alternatively avoid the noise caused by switching the gain of the amplifying unit is by gradually switching the gain of the unit.

The previous description of the preferred embodiments is provided to enable a person skilled in the art to make or use is the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed:

1. An oscillator circuit, comprising:

an amplifying unit containing a first amplifying circuit having a first gain and a second amplifying circuit having a second gain connected in parallel, wherein said amplifying unit inputs an oscillating input signal and amplifies said oscillating input signal in accordance with an overall gain of said amplifier unit to produce an oscillating output signal; and a first control signal generator which is coupled to said amplifying unit, wherein said first control signal generator inputs a first input control signal and generates a corresponding first output control signal, wherein an operational state of said first amplifying circuit is switched when a value of said first output control signal switches, wherein said overall gain is based on said first gain when said operational state of said first amplifying circuit is an enabled state and is not based on said first gain when said operational state of said first amplifying circuit is a disabled state, wherein said first control signal generator delays switching said value of said first output control signal in response to a switching of a value of said first input control signal so that noise generated when said value of said first input control signal switches does not influence said oscillating output signal, wherein said first control signal generator comprises:

a latch circuit which inputs said first input control signal at a first time and latches said first input control signal as said first output control signal at a second time after said first time, wherein said latch circuit inputs a pulse signal and latches said first input control signal based on a first logic value of said pulse signal, wherein said pulse signal has a frequency which depends upon a frequency of said oscillating output signal, and wherein said first control signal generator further comprises:

a voltage comparator which inputs said oscillating output signal from said amplifying unit and a reference voltage signal, which outputs said pulse signal having a second logic value if said oscillating output signal is greater than said reference voltage, and which outputs said pulse signal having said first logic value if said oscillating output signal is less than said reference voltage.

2. The oscillator circuit as claimed in claim 1, wherein said latch circuit comprises:

a first inverter which inverts said first input control signal to produce an inverted first input control signal when said pulse signal has said second logic value;

a second inverter having an input terminal operatively coupled to an output terminal of said first inverter; and a third inverter having an input terminal operatively coupled to an output terminal of said second inverter and having an output terminal operatively coupled to said input terminal of said second inverter, wherein said third inverter is enabled when said pulse signal has said first logic value, wherein said second inverter inputs said inverted first input control signal and inverts said inverted first input control signal as said first output control signal when said pulse signal has said second logic value.

3. The oscillator circuit as claimed in claim 2, further comprising a shaping circuit connected to said amplifying unit, wherein said shaping circuit inputs said oscillating output signal and generates a clock signal, wherein said clock signal has a first clock signal value when said oscillating output signal is greater than an upper threshold value and has a second clock signal value when said oscillating output signal is less than a lower threshold.

4. The oscillator circuit as claimed in claim 3, wherein said reference voltage is greater than said upper threshold value and a maximum value of said oscillating output signal is greater than said reference voltage.

5. The oscillator circuit as claimed in claim 3, wherein said reference voltage is less than said lower threshold value and a minimum, value of said oscillating output signal is less than said reference voltage value.

6. The oscillator circuit as claimed in claim 2, wherein said first amplifying circuit comprises:

a first transistor which inputs said first output control signal via a gate and turns ON to place said first amplifying circuit in said enabled state when said first output control signal has a first control signal value and turns OFF to place said first amplifying circuit in said disabled state when said first output control signal has a second control signal value; and a second transistor connected in series to said first transistor, wherein a gate of said second transistor inputs said oscillation input signal and amplifies said oscillation input signal in accordance with said first gain when said first transistor is turned ON and does not amplify said oscillation input signal when said first transistor is turned OFF.

7. The oscillator circuit as claimed in claim 6, further comprising:
an inverter which inputs said first output control signal and generates an inverted first output control signal,
wherein said first amplifying circuit further comprises:
a third transistor which inputs said inverted first output control signal via a gate and turns ON to place said first amplifying circuit in said enabled state when said first output control signal has said first control signal value and turns OFF to place said first amplifying circuit in said disabled state when said first output control signal has said second control signal value; and
a fourth transistor connected in series to said third transistor, wherein a gate of said fourth transistor inputs said oscillation input signal and amplifies said oscillation input signal in accordance with said first gain when said third transistor is turned ON and does not amplify said oscillation input signal when said third transistor is turned OFF.

8. The oscillator circuit as claimed in claim 6, wherein said first control signal generator inputs a second input control signal and generates a corresponding second output control signal, wherein an operational state of said second amplifying circuit is switched when a value of said second output control signal switches,
wherein said overall gain is based on said second gain when said operational state of said second amplifying circuit is said enabled state and is not based on said second gain when said operational state of said second amplifying circuit is said disabled state, and
wherein said first control signal generator delays switching said value of said second output control signal in response to a switching of a value of said second input control signal so that noise generated when said value of said second input control signal switches does not influence said oscillating output signal.

9. An oscillator circuit, comprising:
an amplifying unit containing a first amplifying circuit having a first gain and a second amplifying circuit having a second gain connected in parallel, wherein said amplifying unit inputs an oscillating input signal and amplifies said oscillating input signal in accordance with an overall gain of said amplifier unit to produce an oscillating output signal; and
a first control signal generator which is coupled to said amplifying unit,
wherein said first control signal generator inputs a first input control signal and generates a corresponding first output control signal, wherein said first amplifying circuit is in an enabled state when said first output control signal has a first control signal value and is in a disabled state when said first output control signal has a second control signal value,
wherein said overall gain is based on said first gain when said first amplifying circuit is in said enabled state and is not based on said first gain when said first amplifying circuit is in said disabled state,
wherein said first gain varies in accordance with a changing value of said first output control signal when said changing value varies between said first control signal value and said second control signal value,
wherein said first control signal generator gradually changes said changing value of said first output control signal from said first control signal value to said second control signal value when a value of said first input control signal switches from a first value to a second value in order to gradually vary said first gain,
wherein said first control signal generator comprises:
a delay circuit which has a predetermined time constant, which inputs said first input control signal, and which outputs said first output control signal,
wherein said delay circuit gradually increases said changing value of said first output control signal from said first control signal value to said second control signal value in accordance with said predetermined time constant when said first input control signal switches from said first value to said second value, and
wherein said delay circuit further comprises:
a first inverter which inputs said first input control signal and outputs a first intermediate inverted signal;
a second inverter which inputs said first intermediate inverted signal and outputs a second intermediate inverted signal; and
a delay which delays said second intermediate inverted signal to produce said first output control signal based on said predetermined time constant.

10. The oscillation circuit as claimed in claim 9, wherein said delay comprises:
a resistor having an input terminal and an output terminal; and
a capacitor connected between said output terminal of said resistor and ground,
wherein said resistor inputs said second intermediate inverted signal via said input terminal and outputs said first output control signal via said output terminal.

11. An oscillator circuit, comprising:
an amplifying unit containing a first amplifying circuit having a first gain and a second amplifying circuit having a second gain connected in parallel, wherein said amplifying unit inputs an oscillating input signal and amplifies said oscillating input signal in accordance with an overall gain of said amplifier unit to produce an oscillating output signal; and
a first control signal generator which is coupled to said amplifying unit,
wherein said first control signal generator inputs a first input control signal and generates a corresponding first output control signal, wherein said first amplifying circuit is in an enabled state when said first output control signal has a first control signal value and is in a disabled state when said first output control signal has a second control signal value,
wherein said overall gain is based on said first gain when said first amplifying circuit is in said enabled state and is not based on said first gain when said first amplifying circuit is in said disabled state,
wherein said first gain varies in accordance with a changing value of said first output control signal when said changing value varies between said first control signal value and said second control signal value,
wherein said first control signal generator gradually changes said changing value of said first output control signal from said first control signal value to said second control signal value when a value of said first input control signal switches from a first value to a second value in order to gradually vary said first gain,
wherein said first control signal generator comprises:
a delay circuit which has a predetermined time constant, which inputs said first input control signal, and which outputs said first output control signal, wherein said delay circuit gradually increases said changing value of said first output control signal from said first control signal value to said second control signal value in accordance with said predetermined time constant when said first input control signal switches from said first value to said second value;

wherein said first amplifying circuit comprises:
a first-transistor which inputs said first output control signal via a gate and gradually turns ON to place said first amplifying circuit in said enabled state when said first output control signal gradually changes from said first control signal value to said second control signal value and gradually turns OFF to place said first amplifying circuit in said disabled state when said first output control signal gradually changes from said second control signal value to said first control signal value; and
a second transistor connected in series to said first transistor, wherein a gate of said second transistor inputs said oscillation input signal and amplifies said oscillation input signal based on an operational state of said first transistor, wherein said oscillator circuit further comprises:
an inverter which inputs said first output control signal and generates an inverted first output control signal,
wherein said first amplifying circuit further comprises:
a third transistor which inputs said inverted first output control signal via a gate and gradually turns ON to place said first amplifying circuit in said enabled state when said first output control signal gradually changes from said first control signal value to said second control signal value and gradually turns OFF to place said first amplifying circuit in said disabled state when said first output control signal gradually changes from said second control signal value to said first control signal value; and
a fourth transistor connected in series to said third transistor, wherein a gate of said fourth transistor inputs said oscillation input signal and amplifies said oscillation input signal based on an operational state of said third transistor, wherein said first control signal generator inputs a second input control signal and generates a corresponding second output control signal, wherein said second amplifying circuit is in an enabled state when said second output control signal has said first control signal value and is in a disabled state when said second output control signal has said second control signal value, wherein said overall gain is based on said second gain when said second amplifying circuit is in said enabled state and is not based on said second gain when said second amplifying circuit is in said disabled state, wherein said second gain varies in accordance with a changing value of said second output control signal when said changing value varies between said first control signal value and said second control signal value, and wherein said first control signal generator gradually changes said changing value of said second output control signal from said first control signal value to said second control signal value when a value of said second input control signal switches from said first value to said second value in order to gradually vary said second gain.

12. An oscillator circuit, comprising:
an amplifying unit containing a first amplifying circuit having a first gain and a second amplifying circuit having a second gain connected in parallel, wherein said amplifying unit inputs an oscillating input signal and amplifies said oscillating input signal in accordance with an overall gain of said amplifier unit to produce an oscillating output signal; and
a first control signal generator which is coupled to said amplifying unit,
wherein said first control signal generator inputs a first input control signal and generates a corresponding first output control signal, wherein said first amplifying circuit is in an enabled state when said first output control signal has a first control signal value and is in a disabled state when said first output control signal has a second control signal value,
wherein said overall gain is based on said first gain when said first amplifying circuit is in said enabled state and is not based on said first gain when said first amplifying circuit is in said disabled state,
wherein said first gain varies in accordance with a changing value of said first output control signal when said changing value varies between said first control signal value and said second control signal value,
wherein said first control signal generator gradually changes said changing value of said first output control signal from said first control signal value to said second control signal value when a value of said first input control signal switches from a first value to a second value in order to gradually vary said first gain;
wherein said first control signal generator comprises:
a delay circuit which has a predetermined time constant, which inputs said first input control signal, and which outputs said first output control signal,
wherein said delay circuit gradually increases said changing value of said first output control signal from said first control signal value to said second control signal value in accordance with said predetermined time constant when said first input control signal switches from said first value to said second value;
said oscillator circuit further comprising:
an initial control signal generator which is coupled to said first control signal generator,
wherein said initial control signal generator inputs an initial input control signal and generates said first input control signal based on said initial input control signal, and
wherein said initial control signal generator delays switching a value of said first input control signal in response to a switching of a value of said initial input control signal.

13. The oscillator circuit as claimed in claim 12, wherein said initial control signal generator comprises:
a latch circuit which inputs said initial input control signal at a first time and latches said initial input control signal as said first input control signal at a second time after said first time.

14. The oscillator circuit as claimed in claim 13, wherein said latch circuit inputs a pulse signal and latches said initial input control signal based on a first logic value of said pulse signal.

15. The oscillator circuit as claimed in claim 14, wherein said pulse signal has a frequency which depends upon a frequency of said oscillating output signal.

16. The oscillator circuit as claimed in claim 15, wherein said initial control signal generator further comprises:

a voltage comparator which inputs said oscillating output signal from said amplifying unit and a reference voltage signal, which outputs said pulse signal having a second logic value if said oscillating output signal is greater than said reference voltage, and which outputs said pulse signal having said first logic value if said oscillating output signal is less than said reference voltage.

17. The oscillator circuit as claimed in claim 16, wherein said latch circuit comprises:

a first inverter which inverts said initial input control signal to produce an inverted initial input control signal when said pulse signal has said second logic value;

a second inverter having an input terminal operatively coupled to an output terminal of said first inverter; and a third inverter having an input terminal operatively coupled to an output terminal of said second inverter and having an output terminal operatively coupled to said input terminal of said second inverter, wherein said third inverter is enabled when said pulse signal has said first logic value, wherein said second inverter inputs said inverted initial input control signal and inverts said inverted initial input control signal as said first input control signal when said pulse signal has said second logic value.

18. The oscillator circuit as claimed in claim 17, further comprising a shaping circuit connected to said amplifying unit, wherein said shaping circuit inputs said oscillating output signal and generates a clock signal, wherein said clock signal has a first clock signal value when said oscillating output signal is greater than an upper threshold value and has a second clock signal value when said oscillating output signal is less than a lower threshold.

19. The oscillator circuit as claimed in claim 18, wherein said reference voltage is greater than said upper threshold value and a maximum value of said oscillating output signal is greater than said reference voltage.

20. The oscillator circuit as claimed in claim 19, wherein said reference voltage is less than said lower threshold value and a minimum value of said oscillating output signal is less than said reference voltage value.

21. An oscillator circuit comprising:

a first node connected to one electrode of an oscillator;

a second node connected to the other electrode of said oscillator;

a first amplifying circuit connected between said first node and said second node and having a first gain;

a second amplifying circuit connected to said first node, said second node, and to a control node, and said second amplifying circuit having a second gain;

a Schmitt trigger circuit connected between said second node and an output terminal, and having a first threshold voltage and a second threshold voltage; and a timing generator connected to said second node, said control node, and a gain input terminal supplying a gain control signal, said timing generator having a third threshold voltage outside a voltage range between said first and second threshold voltages, and generating a control clock signal from a pulse of said second node based on said third threshold voltage, and outputting said gain control signal to said control node in response to said control clock signal;

wherein said second amplifying circuit is activated by said gain control signal of a first level at said control node and is deactivated by said gain control signal of a second level at said control node.

22. The oscillator as claimed in claim 21 wherein said timing generator has a comparator having a first input node connected to said second node, a second input node receiving said third threshold voltage and an output node connected to a third node for outputting a first comparing result when a voltage level of said pulse is smaller than said third threshold voltage and outputting a second comparing result when a voltage level of said pulse is larger than said third threshold voltage, and a switching circuit connected between said control node and said gain input terminal, and being in non-conductive state when said first comparing result is output and being in conductive state when said second comparing result is output.

* * * * *